US006838951B1

(12) United States Patent
Nieri et al.

(10) Patent No.: US 6,838,951 B1
(45) Date of Patent: Jan. 4, 2005

(54) FREQUENCY SYNTHESIZER HAVING VCO BIAS CURRENT COMPENSATION

(75) Inventors: Ralph Christopher Nieri, Summerfield, NC (US); Scott Robert Humphreys, Greensboro, NC (US); Tracy Hall, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/453,095

(22) Filed: Jun. 3, 2003

Related U.S. Application Data
(60) Provisional application No. 60/388,012, filed on Jun. 12, 2002.

(51) Int. Cl.[7] .................................................. H03L 7/00
(52) U.S. Cl. ................................ 331/177 V; 331/36 C; 331/185; 331/16; 327/156; 327/157; 327/159
(58) Field of Search ........................... 331/177 V, 36 C, 331/185, 16; 327/156, 157, 159

(56) References Cited

U.S. PATENT DOCUMENTS 5,986,514 A * 11/1999 Salvi et al.

FOREIGN PATENT DOCUMENTS

EP           471433 A2 *  2/1992

OTHER PUBLICATIONS

Greenfield et al. "Using Microprocessors and Microcomputers: The 6800 Family" 1981 John Wiley & Sons Inc p. 10.*
Koo, Yido et al., "A Fully Integrated CMOS Frequency Synthesizer With Charge–Averaging Charge Pump and Dual–Path Loop Filter for PCS– and Cellular–CDMA Wireless Systems," IEEE Journal of Solid–State Circuits, vol. 37, No. 5, May 2002, pp. 536–542.
Koo, Yido et al., "A Fully–Integrated CMOS Frequency Synthesizer with Charge–Averaging Charge Pump and Dual–Path Loop Filter for PCS– and Cellular–CDMA Wireless Systems," 2001 Symposium on VLSI Circuits Digest of Technical Papers, 2001, pp. 43–46.

* cited by examiner

Primary Examiner—Michael B Shingleton
(74) Attorney, Agent, or Firm—Withrow & Terranova, PLLC

(57) ABSTRACT

The present invention provides circuitry for maintaining the desired phase noise across the tuning range of a frequency synthesizer by compensating the voltage controlled oscillator (VCO) bias current according to various tuning parameters available within the frequency synthesizer, thereby reducing overall current drain and inductor quality factor requirements. In general, the present invention includes a VCO bias circuit capable of controlling the VCO bias current in response to a control signal provided by additional circuitry based on the operating frequency of the frequency synthesizer. Further, the VCO bias current changes in response to changing the operating frequency of the frequency synthesizer.

20 Claims, 7 Drawing Sheets

FREQUENCY SYNTHESIZER HAVING VCO BIAS CURRENT COMPENSATION

This application claims the benefit of provisional patent application Ser. No. 60/388,012, filed Jun. 12, 2002, the disclosure of which is hereby incorporated by reference in its entirety.

FIELD OF THE INVENTION

The present invention relates to frequency synthesizers and particularly relates to improving the performance of a frequency synthesizer using a bias current compensation circuit.

BACKGROUND OF THE INVENTION

Radio transceivers commonly use voltage controlled oscillators (VCOs) and frequency synthesizers to generate various radio frequency (RF) signals for use as mixer injection signals. Wireless communication devices are increasingly required to cover a wide range of frequencies to allow operation in multiple regions of the world or in multiple operating standards, for example, EGSM and DCS bands in Europe and US Cellular and PCS bands in the United States. These requirements force VCOs to cover very wide tuning ranges, typically accomplished by the addition or subtraction of capacitance from the resonant tank circuit. At high capacitance values, the voltage swing across the resonant tank circuit drops, decreasing the signal-to-noise ratio of the oscillator, measured as phase noise. Traditionally, VCOs have been over-designed to meet the phase noise requirements under these conditions, leading to excess current drain or excessive inductor quality factor (Q) requirements.

In wideband transceiver applications, a VCO is typically required to tune across several frequency bands over process and temperature variations. This tuning is typically implemented by the addition or subtraction of capacitance from the resonant tank circuit. This addition or subtraction of capacitance causes a large variation in the impedance of the resonant tank circuit, and thus varies the loaded quality factor of the resonant tank circuit. Two important specifications for a VCO in a transceiver application are output voltage amplitude and single sideband phase noise. The quality factor of the VCO resonant tank circuit directly correlates to the VCO voltage amplitude and phase noise performance.

Traditionally, VCOs have been over-designed to meet the phase noise requirements under the worst case tuning conditions, leading to excess current drain or excessive inductor quality factor requirements. Excessive inductor quality factor requirements can lead to increased cost in the form of die area or process technology requirements.

Thus, there remains a need for a VCO capable of meeting the phase noise requirements under the worst case conditions while reducing overall current drain, thereby reducing cost and process technology requirements.

SUMMARY OF THE INVENTION

In general, the present invention includes a voltage-controlled oscillator (VCO) bias circuit capable of controlling a VCO bias current associated with a VCO in a frequency synthesizer in response to a control signal provided by circuitry based on the operating frequency of the frequency synthesizer. As such, the VCO bias current changes in response to changing the operating range, including the operating frequency, of the frequency synthesizer. By adjusting the VCO bias current, the present invention maintains the desired phase noise and output voltage swing across the tuning range of the frequency synthesizer by compensating the VCO bias current based on various tuning parameters available within the frequency synthesizer, thereby reducing overall current drain and inductor quality factor requirements.

In one embodiment, the VCO bias circuit controls the VCO bias current in response to a plurality of control signals provided by a plurality of circuits. The plurality of control signals may include a VCO capacitance select signal, $VTC_{SEL}$, which also controls the VCO coarse tuning switch settings, a divisor control signal used to control the divisor of divider circuitry in a phase-locked loop associated with the frequency synthesizer, and a fine tuning signal used to control the operating frequency of the VCO.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
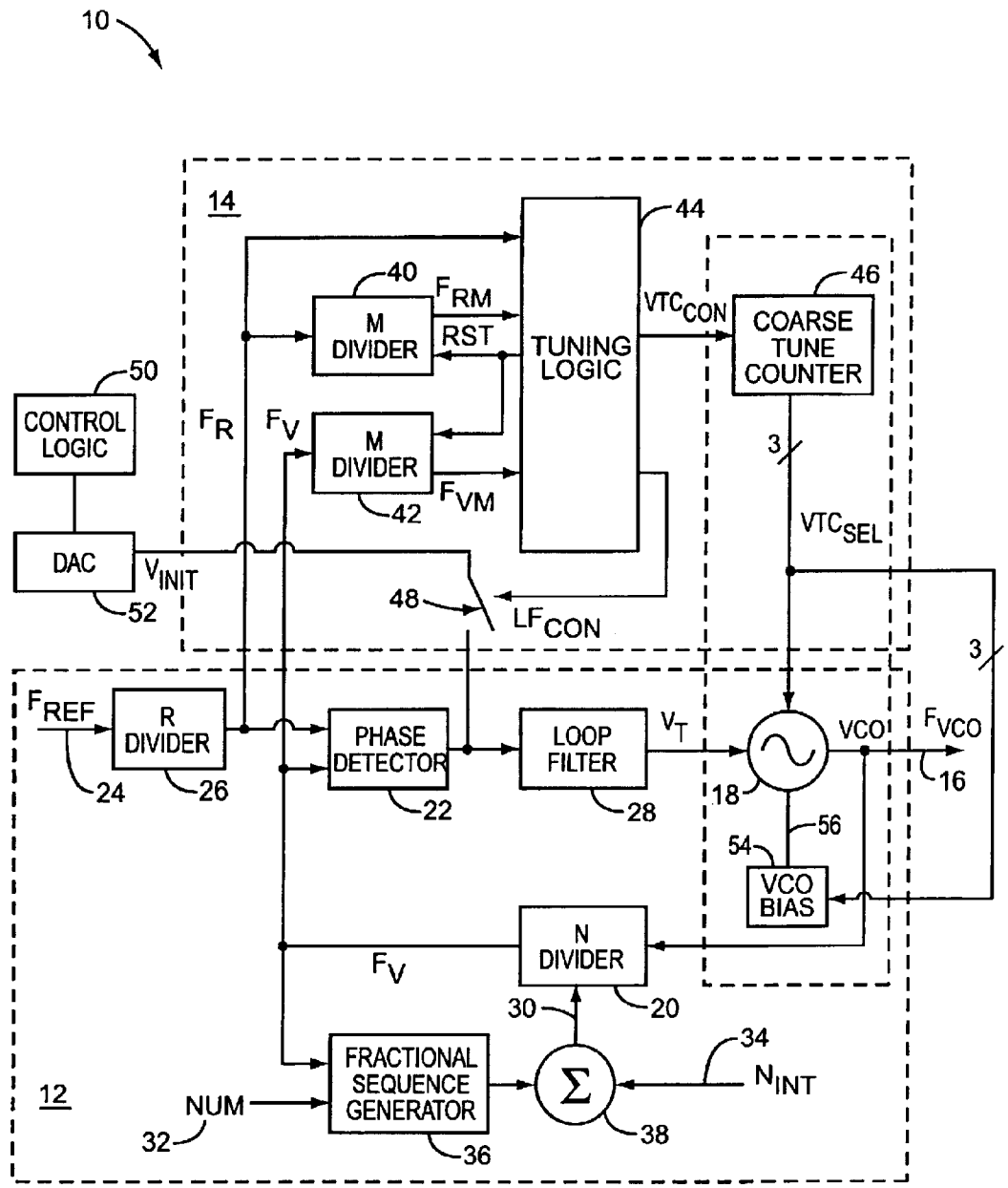
FIG. 1 is a block representation of a frequency synthesizer having VCO bias current compensation according to one embodiment of the present invention.

With reference to FIG. 1, a fractional-N frequency synthesizer 10 is illustrated according to one embodiment of the present invention. The synthesizer 10 includes a fractional-N phase-locked loop (PLL) 12 and coarse tuning circuitry 14. The PLL 12 generates a desired frequency for the output signal 16, $F_{VCO}$, of a voltage controlled oscillator (VCO) 18. In traditional fashion, the output signal $F_{VCO}$ 16 is also provided to divider circuitry 20 to divide the output signal $F_{VCO}$ by a factor N to produce a divided VCO signal $F_V$, which is fed to one of two inputs of a phase detector 22.

A reference signal 24, $F_{REF}$, is divided by a factor R by divider circuitry 26 to produce a divided reference signal, $F_R$, which is provided to the other input of the phase detector 22. The N and R factors are selected so that the frequencies of the divided reference signal, $F_R$, and the divided VCO signal, $F_V$, are equal when the desired output signal 16, $F_{VCO}$, is at a desired frequency. The phase detector 22 compares the relative phases of the divided reference signal, $F_R$, and the divided VCO signal, $F_V$, and provides an output relative to the difference in phase to control the VCO 18. The output of the phase detector 22 is preferably provided by a charge pump (not shown) and filtered by a loop filter 28 to provide a stable voltage for a VCO fine tuning signal, $V_T$, to adjust the desired output frequency 16, $F_{VCO}$, of the VCO 18 based on the difference in phase of the divided reference signal, $F_R$, and the divided VCO signal, $F_V$.

For the fractional-N frequency synthesizer 10, the dividing factor N is generated by varying the divide value 30 of the divider circuitry 20 in order to provide, on average, a fractional (non-integer) value. To create the divide value 30, an integer value 34, $N_{INT}$, is combined with a fractional component. Traditionally, a number 32, NUM, representing a numerator of the fractional component, is processed by a fractional sequence generator 36 to create a sequence of integer values, which have an average value equal to the desired fraction. In one embodiment, the fractional sequence generator 36 employs a third order MASH style delta-sigma modulator.

Each value of the sequence of integer values is summed with the integer value 34, $N_{INT}$, using summing circuitry 38 to create an integer sequence for the divide value 30 (N). The integer sequence will have an average equal to the desired divide value 30 (N). Accordingly, the divider circuitry 20 is loaded with a divide value 30 (N) that may vary from one divide cycle to the next in order to achieve the desired fractional division. The result is significant jitter on the divided VCO signal, $F_V$, which reduces the accuracy of traditional techniques for calibrating the VCO 18.

The coarse tuning circuitry 14 effectively calibrates the frequency range of the VCO 18 for improved fractional-N performance, such as reduced lock time or improved robustness over environmental variations, as described in commonly assigned U.S. patent application Ser. No. 10/127,289 filed Apr. 22, 2002 and entitled COARSE TUNING FOR FRACTIONAL-N SYNTHESIZERS, which is incorporated herein by reference in its entirety. In one implementation, a divider circuit 40 divides the divided reference signal, $F_R$, by a factor of M to create an average reference signal, $F_{RM}$. A second divider circuit 42 divides the divided VCO signal, $F_V$, by a factor of M to create an average VCO signal, $F_{VM}$. Dividing the divided reference frequency, $F_R$, and the divided VCO frequency, $F_V$, by the factor M effectively averages the divided reference frequency, $F_R$, and the divided VCO frequency, $F_V$, over M periods and significantly reduces the jitter appearing on the divided VCO frequency, $F_V$. In one embodiment, where the fractional sequence generator 36 employs a third order MASH style delta-sigma modulator, sufficient smoothing of the divided VCO frequency, $F_V$, is provided when the divider circuits 40 and 42 provide a modulus of 64 (M=64).

Tuning logic 44 processes the average reference signal $F_{RM}$ and average VCO signal $F_{VM}$ to provide a VCO control signal $VTC_{CON}$, which controls calibration of the VCO 18. In the preferred embodiment, the tuning logic 44 is a state machine configured to compare the periods of the average VCO signal $F_{VM}$ and average reference signal $F_{RM}$ and provide a pulse for the control signal $VTC_{CON}$ to control a coarse tune counter 46. The output of the coarse tune counter 46 provides a select signal $VTC_{SEL}$ to select a capacitance value of the VCO's resonant circuit. Alternatively, the tuning logic 44 may generate the VCO select signal $VTC_{SEL}$ directly, for example, as the output of a state machine.

During coarse tuning, the VCO fine tuning signal $V_T$ is forced to a desired initialization value (voltage or current) under the control of the tuning logic 44. Using a switch 48, the initialization value, $V_{INIT}$, is coupled to the output of the loop filter 28 to force the VCO fine tuning signal $V_T$ to the initialization value, $V_{INIT}$. The switch 48 may take many forms, including a transistor biased to provide a switching function. The initialization value, $V_{INIT}$, may be provided using a variety of techniques. In one embodiment, control logic 50 provides a digital value to a digital-to-analog converter (DAC) 52, which provides a corresponding analog voltage for the initialization value, $V_{INIT}$. The tuning logic 44 will typically provide a loop filter control signal, $LF_{CON}$, to cause the switch 48 to apply the initialization voltage, $V_{INIT}$, to the input of the loop filter 28. Detail on coarse tuning is provided later in the specification.

The performance of the VCO 18 is improved by biasing the VCO 18 based on the operating frequency of the synthesizer 10. A VCO bias circuit 54 adjusts the VCO bias current 56, $I_{VCO}$, based on the operating range, including the operating frequency, of the synthesizer 10. There are numerous ways to control the VCO bias circuit 54 based on the operating range or operating frequency of the synthesizer, three of which are identified below. As an example, the VCO select signal $VTC_{SEL}$ also controls the VCO bias circuit 54 thereby adjusting the VCO bias current 56, $I_{VCO}$.

Figure 2A:
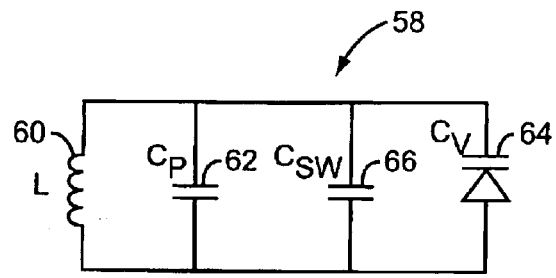
FIG. 2A is a schematic representation of a resonant tank circuit of a voltage controlled oscillator according to one embodiment of the present invention.

With reference to FIG. 2A, the VCO 18 has a tank circuit 58 including parallel inductance 60 (L), fixed or parasitic capacitance 62 ($C_p$), variable capacitance 64 ($C_v$) and switched capacitance 66 ($C_{sw}$). The resonant frequency of the tank circuit 58 is defined by:

$$f = \frac{1}{2\pi\sqrt{L(C_p + C_{sw} + C_v)}}.$$

The variable capacitance 64 ($C_v$) may be a varactor or other continuously variable capacitance. The variable capacitance 64 ($C_v$) is typically used for fine tuning under the control of the fine tuning signal $V_T$ provided by the PLL 12.

Figure 2B:
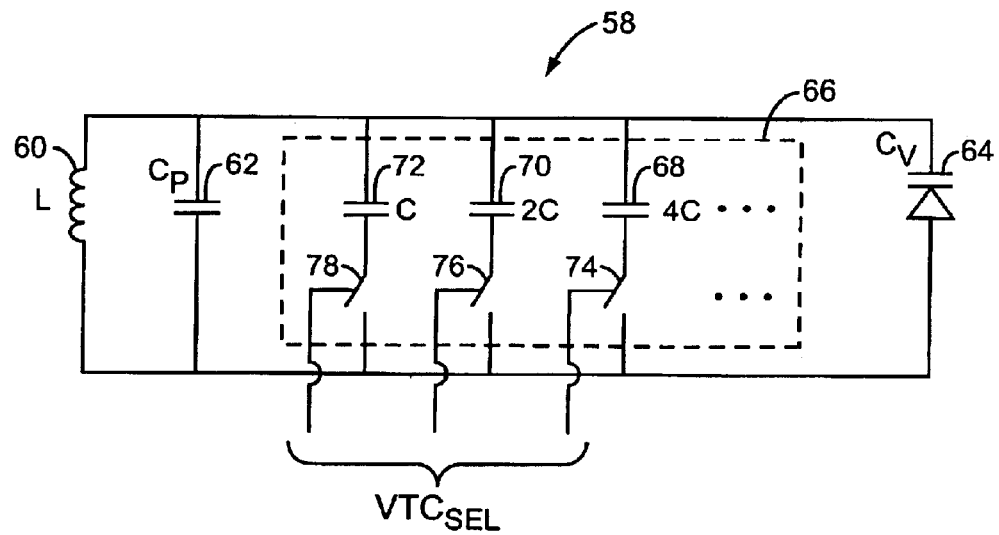
FIG. 2B is an expanded schematic representation of the resonant tank circuit of FIG. 2A.

As shown in FIG. 2B, the switched capacitance 66 is preferably a network of capacitors 68, 70, 72, which can be selectively switched into or out of the VCO tank circuit 58 via switches 74, 76, 78, respectively, for coarse tuning. The switches 74, 76, 78 can take many forms, including transistors biased to operate as switches. The capacitors 68, 70, 72 are preferably binary weighted and switched into the VCO tank circuit 58 under the control of the VCO tank capacitance select signal $VTC_{SEL}$ from the coarse tune counter 46. The VCO tank capacitance select signal $VTC_{SEL}$ is a three bit digital signal, where the bits correspond to the respective capacitance values C, 2C, 4C for the capacitors 68, 70, and 72, respectively. Accordingly, VTC signal values 000 (binary) through 111 will correlate to capacitance values 0 through 7C for the switched capacitance 66 of the VCO tank circuit 58. Alternatively, the capacitors may be unit weighted, for example, to allow an interdigitated layout for better matching, as is well known in the art. In this case, a translation circuit may be needed between the output of the coarse tune counter 46 and the VCO 18. Those skilled in the art will recognize that a variety of simpler techniques may be used to achieve this same translation. For example, in place of the coarse tune counter 46, a shift register constructed to start with its outputs at logical zero (or one) and shift in a series of logical ones (or zeros) in response to each pulse on the control signal $VTC_{CON}$ may be used.

Figure 3:
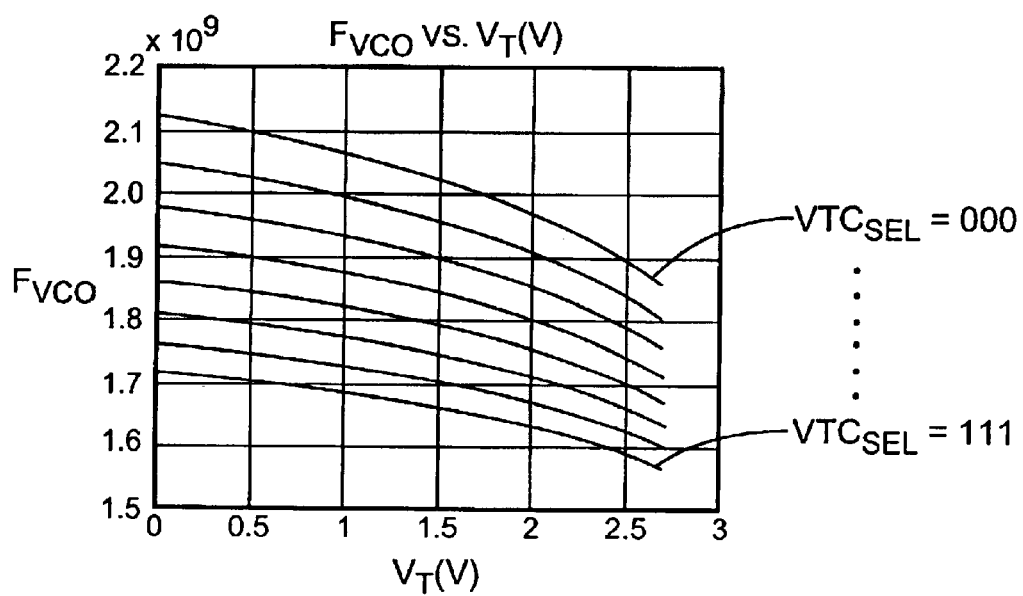
FIG. 3 is a graphic representation of the tuning curves for an exemplary voltage controlled oscillator according to one embodiment of the present invention.

The operating characteristics for an exemplary VCO 18 having the above-configured VCO tank circuit 58 are shown in FIG. 3. Since the switched capacitance 66 can be configured to have one of eight capacitance values, the VCO 18 will have eight tuning curves corresponding to the respective capacitance values. The bottom tuning curve corresponds to having all three capacitors 68, 70, 72 switched into the network when the select signal, $VTC_{SEL}$, is 111. The top tuning curve corresponds to having all three capacitors 68, 70, 72 switched out of the network when the select signal $VTC_{SEL}$ is 000. Depending on the fine tuning signal voltage, $V_T$, there are multiple tuning curves capable of providing a selected frequency. For best noise performance and more consistent tuning gain for the VCO 18, the voltage of the fine tuning signal, $V_T$, should be kept within an acceptable range. Typically, the loaded quality factor (Q) of the varactor 64 tends to fall off at higher capacitance and lower frequency values. For this example, assume the preferred operating range for the VCO 18 corresponds to a fine tuning signal voltage $V_T$ between 0.4 and 1.6 volts.

Figure 4:
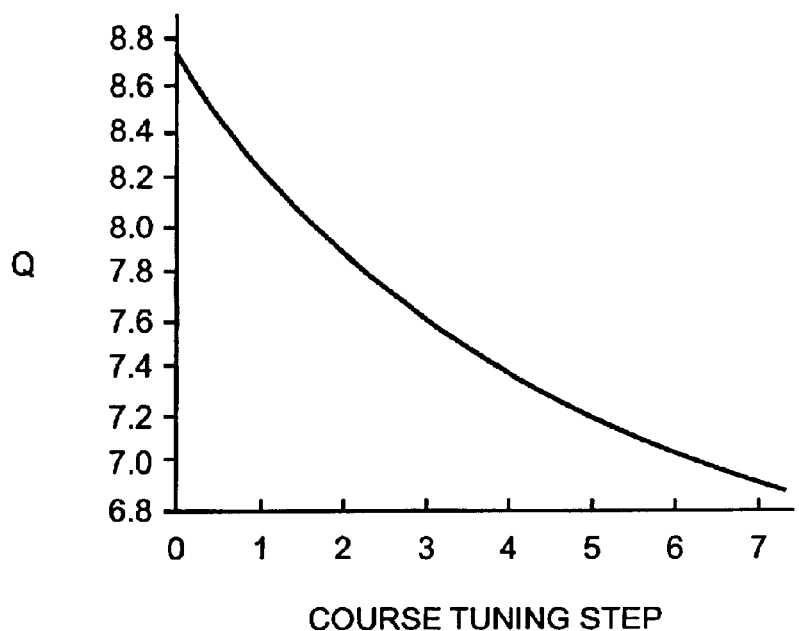
FIG. 4 is a graphic representation of the resonant tank quality factor for an exemplary voltage controlled oscillator according to one embodiment of the present invention.

Since the amount of capacitance loading the tank circuit 58 will vary significantly from the binary setting of 000 to the binary setting of 111, the oscillator output voltage will also vary significantly. This is due to the change in the Q of the resonant tank circuit 58. As illustrated in FIG. 4, the quality factor Q is at a maximum when $VTC_{SEL}$ is 000 and a minimum when $VTC_{SEL}$ is 111. Varying the quality factor Q will also affect the single sideband phase noise (SSBN) associated with the output of the VCO 18, which is often a design parameter for the VCO 18 when used in transceiver applications. Single sideband phase noise is defined as the ratio of the power in one phase modulation sideband to the total signal power. The phase modulation sideband is based on a per Hertz of bandwidth at an offset fm away from the carrier. An equation for modeling oscillator phase noise is given by:

$$L(f_m) = 10\log\left[\frac{1}{2}\left(\left(\frac{fo}{2Qf_m}\right)^2 + 1\right)\left(\frac{fc}{f_m} + 1\right)\left(\frac{FkT}{P_s}\right)\right].$$

From this equation, it can be readily seen that if the total signal power ($P_s$) of the VCO 18 increases then the single sideband phase noise of the VCO 18 will decrease. Since the coarse tuning capacitance changes from coarse tuning step 000 to step 111, the resonant tank quality factor Q also changes. Therefore, the change in quality factor Q can be offset by changing the total signal power of the VCO 18.

The VCO bias circuit 54 of the present invention adjusts the VCO bias current 56, thereby changing the total signal power ($P_s$), as the VCO 18 is tuned by the coarse tuning circuitry 14 to compensate for the changing quality factor Q caused by varying the total capacitance of the tank circuit 58 of the VCO 18. This compensation can be done to keep the VCO single sideband phase noise relatively constant over the coarse tuning steps. In addition or alternatively, the compensation can be done to keep the output voltage relatively constant over the coarse tuning steps. In the preferred embodiment, the VCO tank capacitance select signal, $VTC_{SEL}$, is used to control the VCO bias circuit 54 such that the VCO bias current 56 is adjusted to compensate the changing quality factor Q. Alternatively or in combination, the VCO divide value N of divider 20, the coarse tuning setting of the VCO 18, or the fine tuning signal, $V_T$, may be used to control the VCO bias circuit 54.

An alternative method known in the art for meeting the phase noise requirements is to design a VCO bias network to meet the required phase noise specification for the coarse tuning step with the minimum quality factor Q. This will ensure that the phase noise and the output voltage for the worst case coarse tuning condition meet the design specification. However, this will result in excessive current drain for the coarse tuning step with the maximum quality factor Q. This method could also result in excessive oscillation amplitude for the maximum quality factor Q. Excessive oscillator amplitude can result in a degradation of phase noise, since excessive amplitude can cause the active devices to go into saturation or the fine tuning diodes of the VCO 18 to become forward biased. For these reasons, the VCO bias circuit 54 of the present invention offers advantages to this bias approach.

Figure 5:
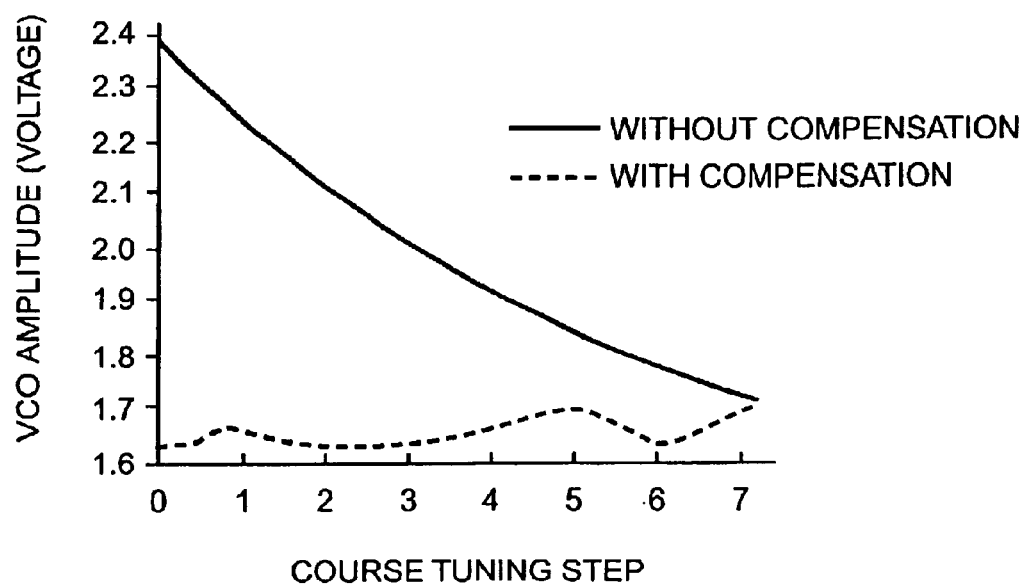
FIG. 5 is a graphic comparison of the output voltage of an exemplary voltage controlled oscillator having bias current compensation with the output voltage of an exemplary voltage controlled oscillator having a constant bias current.

FIG. 5 illustrates one benefit of adjusting the VCO drain current as the capacitance of the tank circuit 58 of the VCO 18 changes. The amplitude of the VCO output signal when the VCO bias current 56 is constant over coarse tuning steps 000 to 111 is depicted by the solid curve. The dashed curve illustrates the amplitude of the VCO output signal when the VCO bias current 56 is adjusted by the VCO bias circuit 54 of the present invention over coarse tuning steps 000 to 111. The large amplitude variation of the constant bias current design can cause performance issues in a wideband transceiver system.

Figure 6:
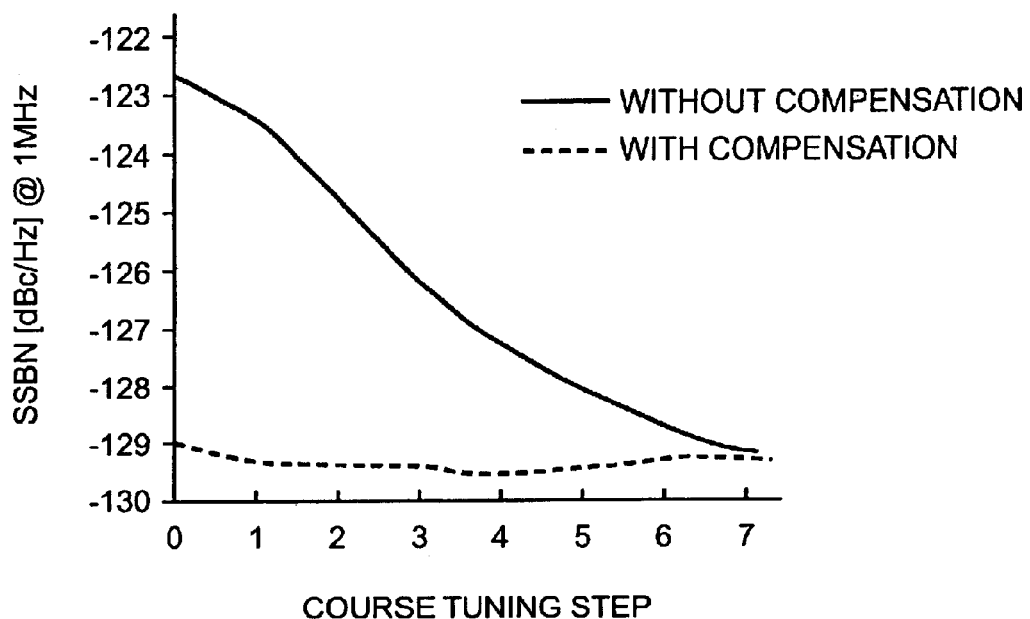
FIG. 6 is a graphic comparison of the single sideband phase noise of an exemplary voltage controlled oscillator having bias current compensation with the single sideband phase noise of an exemplary voltage controlled oscillator having a constant bias current.

FIG. 6 compares the single sideband noise of the VCO 18 without the VCO bias circuit 54, and the single sideband noise of the VCO 18 with the VCO bias circuit 54. As is evident, the single sideband noise of the VCO output signal when the VCO bias current 56 is compensated due to the changing quality factor is nearly constant over all coarse tuning steps, and more importantly, the noise is at a level essentially equal to or less than the noise level for the VCO output signal when the VCO bias current 56 is constant. The large phase noise variation of the constant bias design can cause performance issues in a wideband transceiver system.

Figure 7:
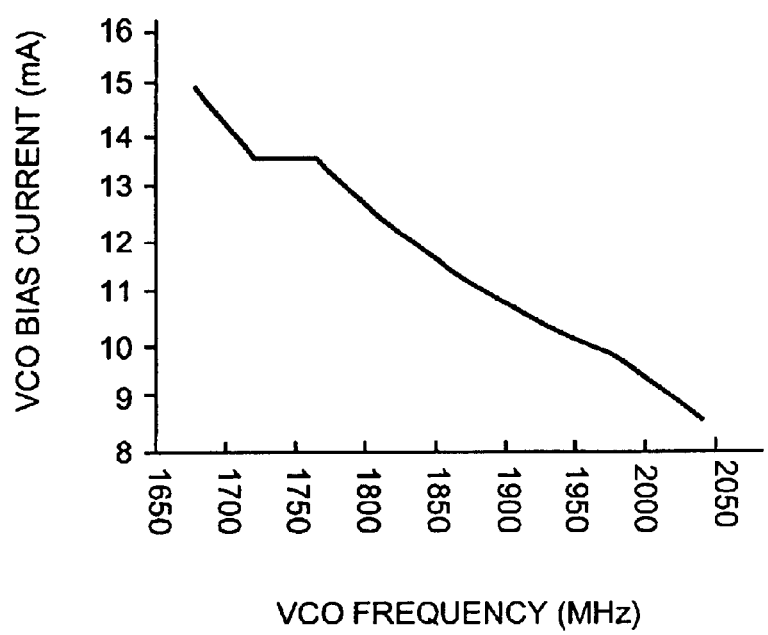
FIG. 7 is a graphic representation of the bias current of an exemplary voltage controlled oscillator having bias current compensation according to one embodiment of the present invention.

The correlation between the desired VCO bias current 56 and the frequency of the VCO output, $F_{VCO}$, is shown in FIG. 7. According to one embodiment of the present invention, the coarse tuning circuitry 14 may further be used to control the VCO bias circuit 54 in order to compensate the VCO bias current 56 for changes in the capacitance of the tank circuit 58 of the VCO 18 caused by the coarse tuning circuitry 14. Due to this correlation, the VCO bias current 56 can be set according to the VCO select signal $VTC_{SEL}$ when the frequency of the VCO output signal, $F_{VCO}$, is determined by the coarse tuning circuitry 14. Further, the VCO bias circuit 54 can be any variable current supply that is used to vary the VCO bias current 56 and is capable of being controlled by a control signal such as the select signal $VTC_{SEL}$.

Figure 8:
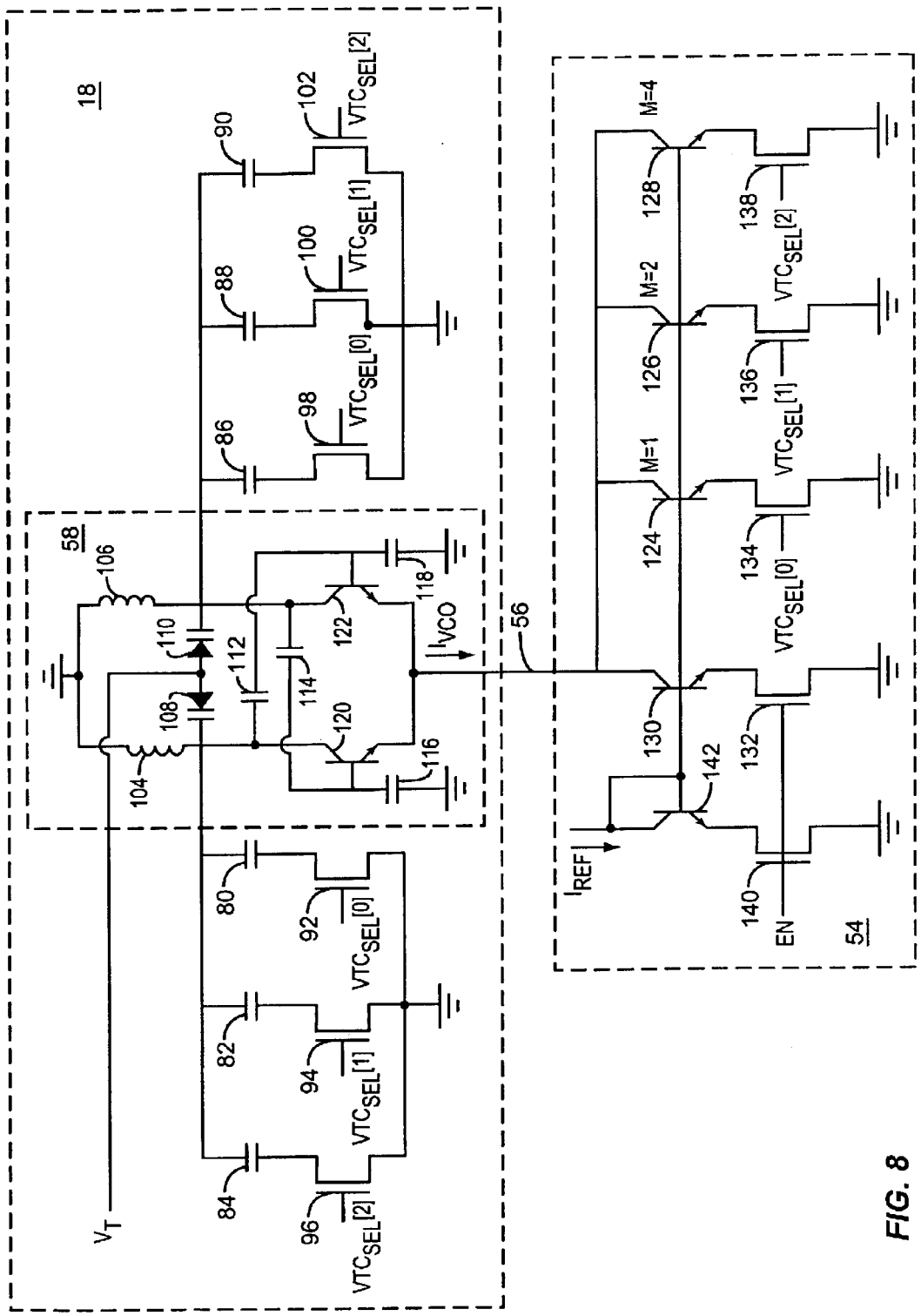
FIG. 8 is a detailed schematic of a voltage controlled oscillator and a VCO bias circuit according to one embodiment of the present invention.

FIG. 8 illustrates one embodiment of the VCO 18 and the VCO bias circuit 54. In this embodiment, the VCO 18 includes tuning capacitors 80, 82, 84, 86, 88, and 90 attached to the tank circuit 58 and coupled in series with transistor switches 92, 94, 96, 98, 100, and 102 to ground. Switches 92, 94, 96, 98, 100, and 102 are controlled by corresponding bits $VTC_{SEL}[0]$. $VTC_{SEL}[1]$, and $VTC_{SEL}[2]$ of the VCO capacitance select signal $VTC_{SEL}$. The tank circuit 58 includes inductors 104 and 106, fine tuning varactors 108 and 110, fixed capacitors 112, 114, 116, and 118, and a differential pair including transistors 120 and 122, where these elements along with the coarse tuning capacitors 80, 82, 84, 86, 88, and 90 define the frequency of the output signal of the VCO 18. The fine tuning signal, $V_T$, controls the fine tuning of the tank circuit by biasing the varactors 108 and 110.

The VCO bias current 56, $I_{VCO}$, is set by switching on a number of switched current mirror devices 124, 126, and 128 using the corresponding bits of the VCO capacitance select signal $VTC_{SEL}$. In this example, the VCO bias current 56 is equal to the sum of a fixed current through fixed current device 130 and fixed current switch 132, plus the currents from switched mirror devices 124, 126, and 128 with binary weighting m=1, m=2, and m=4. According to this embodiment the switched current mirror devices 124, 126, and 128 have binary weighting; however, other weighting schemes such as a unitary weighting scheme could be used and should be considered within the spirit and scope of the present invention. The switched current mirror devices 124, 126, and 128 are enabled or disabled by current mirror switches 134, 136, and 138, which are also controlled by the corresponding bits $VTC_{SEL}[0]$, $VTC_{SEL}[1]$, and $VTC_{SEL}[2]$ of the VCO capacitance select signal $VTC_{SEL}$ used for coarse tuning of the VCO 18. Further, the VCO bias circuit 54 can be switched on or off using enable switch 140, which is controlled by the enable signal (EN). Once enabled, the enable switch 140 allows a reference current ($I_{REF}$) to flow through a reference current device 142 and asserts the fixed current switch 132 such that fixed current flows through the fixed current device 130.

Figure 9:
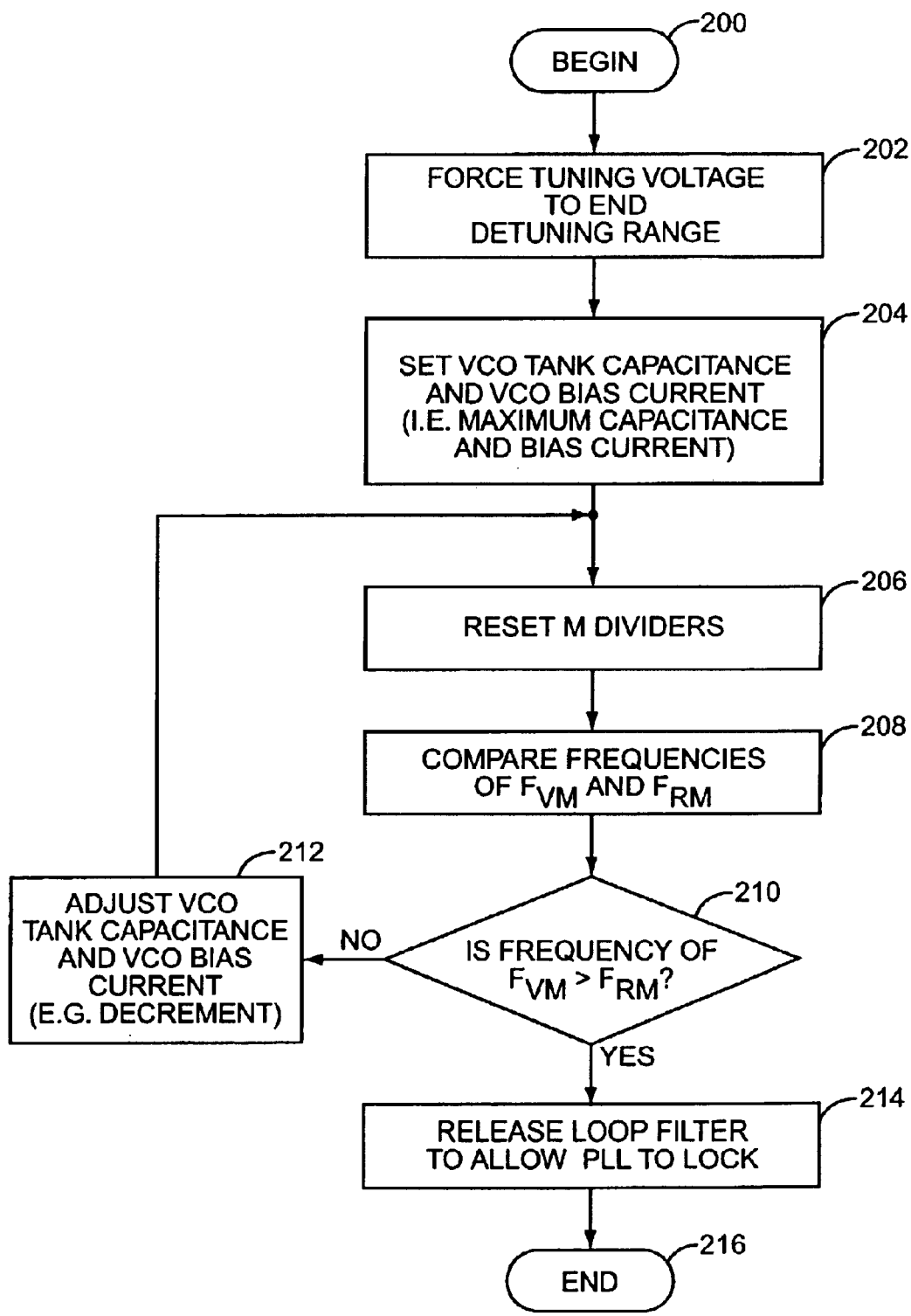
FIG. 9 is a flow diagram outlining a coarse tuning process and bias current compensation according to one embodiment of the present invention.

In operation, a coarse tuning and bias current compensation process is carried out each time the PLL 12 is enabled. The tuning process selects an appropriate capacitance setting for the switched capacitance 66 within a period of time sufficiently short that it does not significantly impact the lock time for the PLL 12. In general, the process operates by comparing the periods of the average VCO signal $F_{VM}$ and the average reference signal $F_{RM}$ and selecting an appropriate capacitance for the switched capacitance 66 to set the frequency of the VCO's output signal 16, $F_{VCO}$. The process also sets the VCO bias circuit 54 to operate such that an appropriate level of VCO bias current compensation is achieved. Preferably, the process repeats for each tuning curve by progressively incrementing or decrementing different switched capacitance values 66 until an acceptable tuning curve is selected. Further details for the tuning process according to one embodiment of the present invention are provided in association with the flow diagram of FIG. 9.

The coarse tuning process begins (step 200) by forcing the tuning voltage of the VCO fine tuning signal $V_T$ to one end of the acceptable range (step 202). For the illustrated example, the VCO fine tuning signal $V_T$ is forced to 0.4 volts. Assume the control logic 50 sends a digital value to the DAC 52 to set the initialization voltage, $V_{INIT}$, to 0.4 volts. The tuning logic 44 will then activate the loop filter control signal $LF_{CON}$ to close switch 48 and apply the initialization voltage, $V_{INIT}$, to the input of the loop filter 28. Applying a constant voltage to the loop filter 28, which is typically a low pass filter, forces the VCO fine tuning signal $V_T$ to 0.4 volts.

Next, the capacitance of the tank circuit 58 for the VCO 18 is set to select a tuning curve corresponding to a minimum frequency range and the VCO bias circuit 54 is set to allow the appropriate VCO bias current (step 204). Accordingly, the coarse tune counter 46 generates a select signal $VTC_{SEL}$ to switch each of the capacitors 68, 70, and 72 into the switched capacitance 66 to set the VCO 18 to operate at the minimum frequency range. Further, the select signal $VTC_{SEL}$ sets the VCO bias circuit 54 to allow the maximum VCO drain current. In this example, the select signal $VTC_{SEL}$ is initialized to 111. In alternative embodiments, the VCO 18 may be initialized for the maximum frequency range and the VCO bias circuit 54 set to allow the minimum VCO drain current. At the start of the coarse tuning operation, the switched capacitance 66 is initialized and the VCO fine tuning signal $V_T$ is forced to 0.4 volts. The tuning logic 44 then compares the frequencies for the average reference signal $F_{RM}$ and the average VCO signal $F_{VM}$ (step 208).

The frequencies of these signals may be determined in a variety of ways. In the preferred embodiment, divider 40 receives the divided reference signal, $F_R$, and provides an output pulse every M cycles to generate the average reference signal, $F_{RM}$. Similarly, divider 42 receives the divided VCO signal, $F_V$, and provides an output pulse every M cycles to generate the average VCO signal, $F_{VM}$. The tuning logic 44 receives both the average reference signal $F_{RM}$ and the average VCO signal $F_{VM}$. Preferably, the tuning logic 44 resets each of the divider circuits 40 and 42 with the $R_{ST}$ signal (step 206), and then senses whether the first output pulse of the average VCO signal $F_{VM}$ occurs before the first output pulse of the average reference signal $F_{RM}$, indicating that the frequency of the average VCO signal $F_{VM}$ is higher than that of the average reference signal $F_{RM}$. Because the frequency of the average reference signal $F_{RM}$ and the frequency of average VCO signal $F_{VM}$ are simply equal to the frequency of the divided reference signal $F_R$ and the divided VCO signal $F_V$, respectively, divided by M, this condition also indicates that the frequency of the VCO is higher than the desired operating frequency.

With the voltage of the tuning signal at 0.4 volts, the frequency of the output signal $F_{VCO}$ is higher than that desired when the appropriate tuning curve is selected. By comparing the respective periods, if the frequency of the average VCO signal $F_{VM}$ is determined to be less than that of the average reference $F_{RM}$ signal (i.e. the period for $F_{VM}$ is greater than $F_{RM}$) (step 210), the tuning logic 44 preferably provides a control signal $VTC_{CON}$ to decrement the coarse tune counter 46. Decrementing the coarse tune counter 46 results in a VCO select signal $VTC_{SEL}$ decrementing the capacitance value of the switched capacitance 66 to select the next higher tuning curve, which corresponds to the next higher frequency range, and also decrements the VCO bias current drained through the VCO bias circuit 54 (step 212).

The periods for the average VCO signal $F_{VM}$ and the average reference signal $F_{RM}$ are again compared, and the switched capacitance 66 is decremented until the frequency of the average VCO signal $F_{VM}$ is greater than the frequency of the average reference signal $F_{RM}$ (step 210). Once the frequency of the average VCO signal $F_{VM}$ is greater than the frequency of the average reference signal $F_{RM}$, the tuning logic 44 releases the initialization voltage $V_{INIT}$ from the input of the loop filter 28 via the $LP_{CON}$ signal to allow the PLL 12 to lock (step 214) and the process ends (step 216). The tuning logic 44 will maintain the switched capacitance 66 at the appropriate capacitance via the VCO select signal $VTC_{SEL}$ to ensure that the VCO 18 operates at the appropriate tuning curve.

Alternatively, the VCO 18 may be initialized for the maximum frequency range wherein the select signal $VTC_{SEL}$ is 000. During coarse tuning, the VCO fine tuning signal $V_T$ is forced to 1.6 volts and the switched capacitance 66 is incremented until the frequency of the average VCO signal $F_{VM}$ is less than the frequency of the average reference signal $F_{RM}$.

The maximum duration of the coarse tuning process is approximately the period ($M*R/F_{REF}$) of the average reference frequency, $F_{RM}$, times the number of capacitance settings for the switched capacitance 66 of the VCO tank circuit 58. For a 26 MHz reference frequency $F_{REF}$, an R value of 1, an M value of 64, and eight capacitance settings, the coarse tuning operation would take at most 20 microseconds before the phase locking in the PLL 12 can begin. Accordingly, the impact of coarse tuning on locking time of the PLL 12 is minimal. Alternatively, a binary search algorithm may be employed, in which only one frequency comparison is required for each bit of the VCO control signal $VTC_{CON}$. In this example, only three comparisons would be needed instead of eight, further reducing the duration of the coarse tuning operation.

Figure 10:
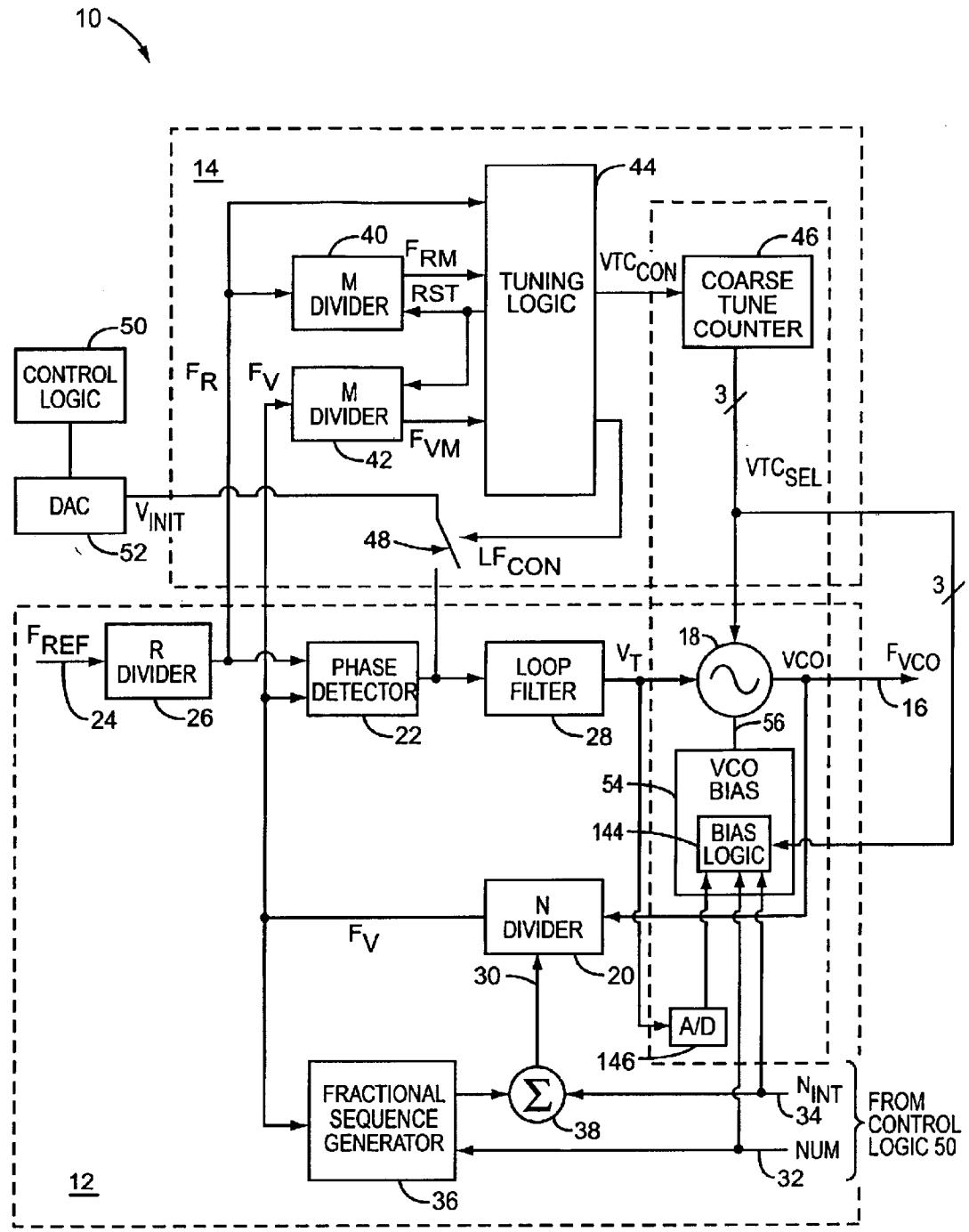
FIG. 10 is a block diagram of additional embodiments of the present invention.

FIG. 10 illustrates alternative embodiments of the present invention. In these embodiments, VCO bias circuit 54 includes bias logic 144, which provides control for the VCO bias circuit 54. In one embodiment, the bias logic 144 controls the VCO bias circuit 54 based on the select signal $VTC_{SEL}$, where the select signal $VTC_{SEL}$ determines the operating range of the VCO 18 by controlling the capacitance of the tank circuit 58. Since the operating range of frequencies is known, the desired VCO bias current 56 can also be determined. In a similar fashion, the bias logic 144 can control the VCO bias circuit 54 based on the integer value $N_{INT}$ the fractional value, or a combination thereof generated by the control logic 50 and used to create the integer sequence for the divide value 30 (N). These values generated by the control logic 50 are representative of the desired operating frequency of the VCO 18 and can therefore be used to control the VCO bias circuit 54. In yet another embodiment, the bias logic 144 controls the VCO bias circuit 54 based on the output of the loop filter 28. The output of the loop filter 28 is the fine tuning signal, $V_T$, used to tune the VCO 18 to the desired operating frequency in the operating range. Hence, the desired operating frequency of the VCO 18 is related to the output of the loop filter 28, and the VCO bias logic 144 can control the VCO bias circuit 54 based on the output of the loop filter 28. Additionally, the output of the loop filter 28 may be digitized by an analog-to-digital (AND converter 146 before being used by the VCO bias logic 144 to control the VCO bias circuit 54. These alternatives may be used separately or in combination and are exemplary rather than limiting.

In general, the VCO bias circuit 54 adjusts the VCO bias current 56, thereby compensating for the changing loaded quality factor Q, as the operating range of the VCO 18 varies due to the change in the capacitance of the tank circuit 58. This adjustment improves the performance of the synthesizer 10 by maintaining a desired level of single sideband phase noise and output voltage at the output of the VCO 18 at each of the operating ranges and frequencies. There are numerous ways to control the VCO bias circuit 54, three of which are given above. However, other ways of controlling the VCO bias circuit 54 are possible and should be considered within the spirit and scope of the present invention.

Preferably, the invention is implemented in a manner minimizing the number of interconnections between the coarse tuning circuitry 14 and the PLL 12, especially in embodiments where the two circuits are on separate packages or semiconductor die. For example, the coarse tune counter 46 and VCO 18 may be placed on a common die, and the coarse tune counter 46 will only require one input to receive the VCO control signal $VTC_{CON}$ to control the value of the switched capacitance 66 of the VCO tank circuit 58 and the VCO bias current through VCO bias circuit 54. This arrangement reduces the number of pins required on the associated semiconductor packages, or the number of bond pads on the associated die, reducing cost and area.

It will be recognized that the present invention applies equally well to oscillators used with any type of synthesizer, including integer-N or fractional-N PLLs. It also will be recognized that the above discussion applies equally well to other types of oscillators that may be used with frequency synthesizers. For example, ring oscillators can be constructed with coarse and fine tuning control signals provided by switched capacitive loads or switched transistor amplifier stages, and supply voltage or current tuning, respectively. Accordingly, elements, such as gain stages or impedance devices, may be selectively switched into or out of the current or voltage controlled oscillator circuitry to select a tuning curve. Further, the counters described herein may be implemented using registers to hold value, or state machines. As such, a counter is deemed to cover and include these configurations.

Additional detail pertaining to ring oscillators is found in, "An all-digital phase-locked loop with 50-cycle lock time suitable for high-performance microprocessors," by J. Dunning et al., IEEE Journal of Solid-State Circuits, Volume 30, Issue 4, Apr. 1995, pages 412–422, which is incorporated herein by reference in its entirety.

Those skilled in the art will recognize improvements and modifications to the preferred embodiments of the present invention. All such improvements and modifications are considered within the scope of the concepts disclosed herein and the claims that follow.

What is claimed is:

1. A frequency synthesizer comprising:
   a voltage controlled oscillator (VCO) bias circuit adapted to control a bias current supplied to a VCO based on a plurality of control signals; and
   circuitry comprising a plurality of circuits adapted to provide said plurality of control signals to said VCO bias circuit, wherein said plurality of control signals are a function of an operating frequency of said VCO and said bias current changes in response to changes in the operating frequency of said VCO.

2. The frequency synthesizer of claim 1 wherein two of said plurality of control signals are selected from a group consisting of a) a capacitance select signal from a coarse tuning circuit associated with a phase-locked loop and said VCO, wherein said capacitance select signal is used to control an operating range of said VCO;

b) a divisor control signal provided to divider circuitry in said phase-locked loop associated with said VCO, wherein said divisor control signal controls a divisor value of said divider circuitry and bears on the operating frequency of said VCO; and c) a fine tuning signal from a loop filter in said phase-locked loop associated with said VCO, wherein said fine tuning signal is used to control the operating frequency of said VCO.

3. The frequency synthesizer of claim 1 wherein three of said plurality of control signals are:

a) a capacitance select signal from a coarse tuning circuit associated with a phase-locked loop and said VCO, wherein said capacitance select signal is used to control an operating range of said VCO;

b) a divisor control signal provided to divider circuitry in said phase-locked loop associated with said VCO, wherein said divisor control signal controls a divisor value of said divider circuitry and bears on the operating frequency of said VCO; and c) a fine tuning signal from a loop filter in said phase-locked loop associated with said VCO, wherein said fine tuning signal is used to control the operating frequency of said VCO.

4. The frequency synthesizer of claim 1 wherein two of said plurality of circuits are selected from a group consisting of:

a) coarse toning circuitry adapted to provide said control signal to said VCO bias circuit and to said VCO to select an operating range of said VCO;

b) control logic adapted to provide said control signal to control a divisor value of divider circuitry associated with a phase-locked loop incorporating said VCO to said divider circuitry and said VCO bias circuitry; and c) a loop filter in said phase-locked loop associated with said VCO, said loop filter adapted to provide said control signal to control the operating frequency of said VCO to said VCO and to said VCO bias circuit.

5. The frequency synthesizer of claim 1 wherein three of said plurality of circuits are:

a) coarse tuning circuitry adapted to provide said control signal to said VCO bias circuit and to said VCO to select an operating range of said VCO;

b) control logic adapted to provide said control signal to control a divisor value of divider circuitry associated with a phase-locked loop incorporating said VCO to said divider circuitry and said VCO bias circuitry; and c) a loop filter in said phase-locked loop associated with said VCO, said loop filter adapted to provide said control signal to control the operating frequency of said VCO to said VCO and to said VCO bias circuit.

6. A frequency synthesizer comprising:

a voltage controlled oscillator (VCO) bias circuit adapted to control a bias current supplied to a VCO based on a control signal; and circuitry adapted to provide said control signal to said VCO bias circuit, wherein said control signal is a function of an operating frequency of said VCO and said bias current changes in response to changes in the operating frequency of said VCO;

wherein said control signal is a capacitance select signal from a coarse tuning circuit associated with a phase-locked loop and said VCO and is used to control an operating range of said VCO.

7. A frequency synthesizer comprising:

a voltage controlled oscillator (VCO) bias circuit adapted to control a bias current supplied to a VCO based on a control signal; and circuitry adapted to provide said control signal to said VCO bias circuit, wherein said control signal is a function of an operating frequency of said VCO and said bias current changes in response to changes in the operating frequency of said VCO;

wherein said control signal is a divisor control signal provided to divider circuitry in a phase-locked loop associated with said VCO and controls the divisor value of said divider circuitry and bears on the operating frequency of said VCO.

8. A frequency synthesizer comprising:

a voltage controlled oscillator (VCO) bias circuit adapted to control a bias current supplied to a VCO based on a control signal; and circuitry adapted to provide said control signal to said VCO bias circuit, wherein said control signal is a function of an operating frequency of said VCO and said bias current changes in response to changes in the operating frequency of said VCO;

said circuitry comprising coarse tuning circuitry adapted to provide said control signal to said VCO to select an operating range of said VCO and also provide said control signal to said VCO bias circuit to control the bias current supplied to said VCO.

9. The frequency synthesizer of claim 8 further comprising said VCO having a network of selectable capacitance responsive to said control signal to control the operating range of said VCO.

10. A frequency synthesizer comprising:

a voltage controlled oscillator (VCO) bias circuit adapted to control a bias current supplied to a VCO based on a control signal; and circuitry adapted to provide said control signal to said VCO bias circuit, wherein said control signal is a function of an operating frequency of said VCO and said bias current changes in response to changes in the operating frequency of said VCO;

wherein said VCO bias circuit comprises at least one current mirror device adapted to produce a current proportional to a fixed current.

11. The frequency synthesizer of claim 10 wherein said VCO bias circuit further comprises at least one switch adapted to control a particular one of said at least one current mirror device based on said control signal thereby controlling the bias current supplied to said VCO.

12. A frequency synthesizer comprising:

means for controlling a bias current supplied to a voltage controlled oscillator (VCO) based on a plurality of control signals; and a plurality of means for providing said plurality of control signals to said means for controlling said bias current, wherein said plurality of control signals are a function of an operating frequency of said VCO and said bias current changes in response to changes in the operating frequency of said VCO.

13. The frequency synthesizer of claim 12 wherein two of said plurality of control signals are selected from a group consisting of:

a) a capacitance select signal from a coarse tuning circuit associated with a phase-locked loop and said VCO, wherein said capacitance select signal is used to control the operating range of said VCO;

b) a divisor control signal provided to divider circuitry in said phase-locked loop associated with said VCO, wherein said divisor cool signal controls the divisor value of said divider circuitry and bears on the operating frequency of said VCO; and c) a fine tuning signal from a loop filter in said phase-locked loop associated with said VCO, wherein said fine tuning signal is used to control the operating frequency of said VCO.

14. The frequency synthesizer of claim 12 wherein three of said plurality of control signals are:

a) a capacitance select signal from a coarse tuning circuit associated with a phase-locked loop and said VCO, wherein said capacitance select signal is used to control an operating range of said VCO;

b) a divisor control signal provided to divider circuitry in said phase-locked loop associated with said VCO, wherein said divisor control signal controls a divisor value of said divider circuitry and bears on the operating frequency of said VCO; and c) a fine tuning signal from a loop filter in said phase-locked loop associated with said VCO, wherein said fine tuning signal is used to control the operating frequency of said VCO.

15. The frequency synthesizer of claim 12 wherein two of said plurality of means for providing said plurality of control signals are selected from a group consisting of:

a) means for providing said control signal to said means for controlling said VCO bias current and to said VCO to select an operating range of said VCO;

b) means for providing said control signal to control a divisor value of divider circuitry associated with a phase-locked loop incorporating said VCO to said divider circuitry and said means for controlling said VCO bias current; and c) means for providing said control signal to control the operating frequency of said VCO to said VCO and to said means for controlling said VCO bias current.

16. The frequency synthesizer of claim 12 wherein three of said plurality of means for providing said plurality of control signals are:

a) means for providing said control signal to said means for controlling said VCO bias current and to said VCO to select an operating range of said VCO;

b) means for providing said control signal to control a divisor value of divider circuitry associated with a phase-locked loop incorporating said VCO to said divider circuitry and said means for controlling said VCO bias current; and c) means for providing said control signal to control the operating frequency of said VCO to said VCO and to said means for controlling said VCO bias current.

17. A frequency synthesizer comprising:

means for controlling a bias current supplied to a voltage controlled oscillator (VCO) based on a control signal; and means for providing said control signal to said means for controlling said bias current, wherein said control signal is a function of an operating frequency of said VCO and said bias current changes in response to changes in the operating frequency of said VCO;

wherein said control signal is a capacitance select signal from a coarse tuning circuit associated with a phase-locked loop and said VCO, wherein said capacitance select signal is used to control an operating range of said VCO.

18. A frequency synthesizer comprising:

means for controlling a bias current supplied to a voltage controlled oscillator (VCO) based on a control signal; and means for providing said control signal to said means for controlling said bias current, wherein said control signal is a function of an operating frequency of said VCO and said bias current chances in response to changes in the operating frequency of said VCO;

wherein said control signal is a divisor control signal provided to divider circuitry in a phase-locked loop associated with said VCO, wherein said divisor control signal controls the divisor value of said divider circuitry and bears on the operating frequency of said VCO.

19. A frequency synthesizer comprising:

means for controlling a bias current supplied to a voltage controlled oscillator (VCO) based on a control signal; and means for providing said control signal to said means for controlling said bias current, wherein said control signal is a function of an operating frequency of said VCO and said bias current chances in response to changes in the operating frequency of said VCO;

said means for providing said control signal comprising a means for coarse tuning the VCO which provides said control signal to said means for controlling said VCO bias current and to said VCO to select an operating range of said VCO.

20. A frequency synthesizer comprising:

means for controlling a bias current supplied to a voltage controlled oscillator (VCO) based on a control signal; and means for providing said control signal to said means for controlling said bias current, wherein said control signal is a function of an operating frequency of said VCO and said bias current changes in response to changes in the operating frequency of said VCO;

said means for providing said control signal comprising a means for providing said control signal to said divider circuitry to control a divisor of divider circuitry associated with a phase-locked loop incorporating said VCO and to said means for controlling said VCO bias current to control said VCO bias current.

* * * * *